(12) United States Patent
Fuderer

(10) Patent No.: US 10,094,898 B2
(45) Date of Patent: Oct. 9, 2018

(54) ZERO ECHO TIME MR IMAGING WITH WATER/FAT SEPARATION

(71) Applicant: KONINKLIJKE PHILIPS N.V., Eindhoven (NL)

(72) Inventor: Miha Fuderer, Eindhoven (NL)

(73) Assignee: KONINKLIJKE PHILIPS N.V., EIndhoven (NL)

(*) Notice: Subject to any disclaimer, the term of this patent is extended or adjusted under 35 U.S.C. 154(b) by 283 days.

(21) Appl. No.: 15/102,544

(22) PCT Filed: Dec. 8, 2014

(86) PCT No.: PCT/EP2014/076802
§ 371 (c)(1),
(2) Date: Jun. 8, 2016

(87) PCT Pub. No.: WO2015/086476
PCT Pub. Date: Jun. 18, 2015

(65) Prior Publication Data
US 2016/0313421 A1 Oct. 27, 2016

(30) Foreign Application Priority Data
Dec. 12, 2013 (EP) ..................... 13196868

(51) Int. Cl.
*G01V 3/00* (2006.01)
*G01R 33/48* (2006.01)
*G01R 33/483* (2006.01)

(52) U.S. Cl.
CPC ....... *G01R 33/4828* (2013.01); *G01R 33/482* (2013.01); *G01R 33/483* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS 6,037,772 A 3/2000 Karczmar et al.
6,879,156 B1 4/2005 Chesler
(Continued)

FOREIGN PATENT DOCUMENTS

WO 2010056749 A1 5/2010
WO 2013001399 A2 1/2013

OTHER PUBLICATIONS

Berker Y et al;"MRI-based attenuation correction for hybrid PET/MRI Systems: A 4-class tissue segmentation technique using a combined ultrashort-echo-time/Dixon MRI sequence",Journal of Nuclear Medicine, Society of Nuclear Medicine, Reston, VA, US,vol. 53, No. 5, May 1, 2012 (May 1, 2012),pp. 796-804.
(Continued)

*Primary Examiner* — Huy Q Phan
*Assistant Examiner* — Raul Rios Russo

(57) ABSTRACT

The invention relates to a method of MR imaging of an object positioned in an examination volume of a MR device (1), the method comprises the steps of:—subjecting the object (10) to an imaging sequence of RF pulses (20) and switched magnetic field gradients(G), which imaging sequence is a zero echo time sequence comprising: i) setting a readout magnetic field gradient (G) having a readout direction and a readout strength; ii) radiating a RF pulse (20) in the presence of the readout magnetic field gradient (G); iii) acquiring a FID signal in the presence of the readout magnetic field gradient (G), wherein the FID signal represents a radial k-space sample; iv) gradually varying the readout direction; v) sampling a spherical volume in k-space by repeating steps i) through iv) a number of times, with the readout strength being varied between repetitions;—reconstructing a MR image from the acquired FID signals, wherein signal contributions of two or more chemical species to the acquired FID signals are separated. It is an object of the invention to enable silent ZTE imaging in combina-
(Continued)

tion with water/fat separation. This is achieved by varying the readout strength such that each position in k-space is sampled at least two times, each time with a different value of the readout strength. Moreover, the invention relates to a MR device and to a computer program for a MR device.

9 Claims, 3 Drawing Sheets

(52) U.S. Cl.
CPC ..... *G01R 33/4816* (2013.01); *G01R 33/4818* (2013.01); *G01R 33/4822* (2013.01); *G01R 33/4824* (2013.01); *G01R 33/4826* (2013.01); *G01R 33/4831* (2013.01); *G01R 33/4833* (2013.01); *G01R 33/4835* (2013.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/38
USPC .................................................. 324/300–322
See application file for complete search history.

(56) References Cited

U.S. PATENT DOCUMENTS

| | | | |
|---|---|---|---|
| 7,602,184 B2 | 10/2009 | Du | |
| 2001/0054898 A1* | 12/2001 | Li | G01R 33/56563 324/307 |
| 2007/0188172 A1 | 8/2007 | Garwood | |
| 2010/0260397 A1 | 10/2010 | Block | |
| 2015/0042335 A1* | 2/2015 | Nehrke | G01R 33/5659 324/309 |
| 2016/0252595 A1* | 9/2016 | Nehrke | A61B 5/055 324/309 |

OTHER PUBLICATIONS

Markus Weiger et al:"ZTE imaging in humans",Magnetic Resonance in Medicine,vol. 70, No. 2, Jun. 14, 2013 (Jun. 14, 2013),pp. 328-332.

David M. Grodzki et al: "Ultrashort echo time imaging using pointwise encoding time reduction with radial acquisition (PETRA)",Magnetic'Resonance in Medicine,vol. 67, No. 2, Jun. 30, 2011 (Jun. 30, 2011), pp. 510-518.

Kang Wang et al: "k-space water-fat decomposition with T2* estimation and multifrequency fat spectrum modeling for ultrashort echo time imaging",Journal of Magnetic Resonance Imaging, vol. 31, No. 4, Mar. 29, 2010 (Mar. 29, 2010) , pp. 1027-1034.

Markus Weiger etal:"MRI with zero echo time: Hard versus sweep pulse excitation", Magnetic Resonance in Medicine,vol. 66, No. 2, Mar. 4, 2011 (Mar. 4, 2011),pp. 379-389.

Holger Eggers et al: "Dual-Echo Dixon Imaging with Flexible Choice of Echo Times",Magnetic Resonance in Medicine,Wiley-Liss, Inc, vol. 65, No. 1,Sep. 21, 2010 (Sep. 21, 2010), pp. 96-107.

Noll D C et al: "A Homogeneity Correction Method for Magnetic Resonance Imaging With Time-Varying Gradients", IEEE Transactions on Medical Imaging, Service Center, Piscataway, NJ, US, vol. 10, No. 4,Dec. 1, 1991 (Dec. 1, 1991), pp. 629-637.

Lustig M et al:"Sparse MRI: the application of compressed sensing for rapid MR imaging"Magnetic Resonance in Medicine, Academic Press, Duluth, MN, US, vol. 58, No. 6,Dec. 1, 2007 (Dec. 1, 2007), pp. 1182-1195.

\* cited by examiner

ZERO ECHO TIME MR IMAGING WITH WATER/FAT SEPARATION

CROSS REFERENCE TO RELATED APPLICATIONS

This application is a U.S. national phase application of International Application No. PCT/EP2014/076802, filed on Dec. 8, 2014, which claims the benefit of EP Application Serial No. 13196868.7 filed on Dec. 12, 2013 and is incorporated herein by reference.

FIELD OF THE INVENTION

The invention relates to the field of magnetic resonance (MR) imaging. It concerns a method of MR imaging of chemical species having at least two different resonance frequencies. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneity) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or other appropriate reconstruction algorithms.

MR imaging of tissues with very short transverse relaxation times, such as bone or lung, is becoming increasingly important. Nearly all known methods for this purpose basically employ three-dimensional (3D) radial k-space sampling. In the so-called zero echo time (ZTE) technique a readout gradient is set before excitation of magnetic resonance with a high-bandwidth and thus short, hard RF pulse. In this way, gradient encoding starts instantaneously upon excitation of magnetic resonance. The acquisition of a free induction decay (FID) signal starts immediately after radiation of the RF pulse resulting in an effectively zero 'echo time' (TE). After the FID readout, only minimal time is required for setting of the next readout gradient before the next RF pulse can be applied, thus enabling very short repetition times (TR). The readout direction is incrementally varied from repetition to repetition until a spherical volume in k-space is sampled to the required extent. Without the need for switching off the readout gradient between TR intervals, ZTE imaging can be performed virtually silently. A known challenge in ZTE imaging is that the k-space data are slightly incomplete in the k-space center due to the initial dead time that is caused by the finite duration of the RF pulse, transmit-receive switching, and signal filtering. The k-space gap can be addressed, for example, by oversampling of the radial k-space acquisition and/or signal extrapolation. However, the gap size must be limited to approximately two to three Nyquist dwell times to avoid significant noise amplification as well as deterioration of the spatial response function (see, for example, Weiger et al., Magnetic Resonance in Medicine, 70, 328-332, 2013). Further, the US-patent applicaton US2007/0188172 discloses a near-zero echo time magnetic resonance method which aims at studying objects having very fast spin-spin relaxation rates.

In MR imaging, it is often desired to obtain information about the relative contribution of different chemical species, such as water and fat, to the overall signal, either to suppress the contribution of some of them or to separately or jointly analyze the contribution of all of them. It is well-known that these contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. In particular for water-fat separation, these types of experiments are often referred to as Dixon-type of measurements. The water-fat separation is possible because there is a known precessional frequency difference of hydrogen in fat and water. In its simplest form, water and fat images are generated by either addition or subtraction of the 'in phase' and 'out of phase' datasets, but this approach is rather sensitive to main field inhomogeneities. However, such a chemical encoding based separation of different species is not restricted to water/fat species only. Other species with other chemical shifts could also be considered.

The known Dixon-type water/fat separation techniques rely on the acquisition of two or more images by an appropriate (spin) echo sequence such that an echo time value can be attributed to each image, which echo time values in combination with the phasing of the acquired images encode the contributions from water and fat spins. However, FID signals are acquired in ZTE imaging, as mentioned above, such that the terms 'echo' and 'echo time' have no meaning. The known Dixon techniques are thus not applicable in combination with ZTE imaging.

SUMMARY OF THE INVENTION

From the foregoing it is readily appreciated that there is a need for an improved method of ZTE imaging. It is an object of the invention to enable 'silent' ZTE imaging in combination with water/fat separation.

In accordance with the invention, a method of MR imaging of an object positioned in the examination volume of a MR device is disclosed. The method of the invention comprises the steps of:

subjecting the object to an imaging sequence of RF pulses and switched magnetic field gradients, which imaging sequence is a zero echo time sequence comprising:
  i) setting a readout magnetic field gradient having a readout direction and a readout strength;
  ii) radiating a RF pulse in the presence of the readout magnetic field gradient;
  iii) acquiring a FID signal in the presence of the readout magnetic field gradient, wherein the FID signal represents a radial k-space sample;
  iv) gradually varying the readout direction;
  v) sampling a spherical volume in k-space by repeating steps i) through iv) a number of times, with the readout strength being varied between repetitions;
reconstructing a MR image from the acquired FID signals, wherein signal contributions of two or more chemical species to the acquired FID signals are separated.

According to the invention, the radial ZTE acquisition is principally applied in the conventional fashion. FID signals are acquired as radial k-space samples by rapidly repeating the radiation of RF pulses while the readout direction is gradually varied until a full spherical volume in k-space is sampled. The invention proposes that, as an additional measure, the strength of the readout magnetic field gradient is varied between at least some of the repetitions of the ZTE sequence such that each k-space region is 'visited' during the scan at least two times, each time with a different value of the readout strength. The application of different readout strengths implies that each k-space position is sampled at two or more different sampling times (i.e. the time interval between the RF pulse and the sampling of a given k-space position). It is the basic insight of the invention that sampling of each region in k-space with two or more different sampling times in ZTE imaging results in a specific phasing of the acquired FID signals which is induced by the (known) precessional frequency difference of the involved chemical species (e.g. hydrogen in fat and water). This phasing encodes the signal contributions from the different chemical species. According to the invention, the separation of the signal contributions is performed by deriving the individual contributions from the phase differences of the acquired FID signals induced by the variation of the readout strength. Preferably, the reconstruction and the separation of the signal contributions consists of two steps: (a) estimating a phase map, i.e. a map reflecting at least main magnetic field inhomogeneity and chemical shift effects (and maybe further phase shift-inducing effects, such as the susceptibility distribution within the imaged object), and (b) separating chemical shift from main magnetic field inhomogeneity by the assumption that the latter varies smoothly over space. Step (b) includes the well-known 'phase unwrapping' problem of Dixon water/fat imaging. Suitable algorithms are well-known and available in existing MR environments. A technique for water/fat separation from MR signals sampled at arbitrary acquisition times, which is principally applicable for the method of invention, is for example described by Eggers et al. (Magnetic Resonance in Medicine, 65, 96-107, 2011).

It has to be noted in this context that the approach of the invention does not necessarily require that exactly each k-space position is sampled at two or more different sampling times. It is sufficient that a certain distribution of k-space positions and sampling times is achieved in order to enable chemical shift separation.

In a preferred embodiment of the invention, the spherical k-space volume is sampled by randomly varying the readout direction and the readout strength. Compressed sensing may be employed for reconstructing the MR image and/or for separating the signal contributions of the two or more chemical species. The theory of compressed sensing (CS) is known to have a great potential for MR image reconstruction from irregularly sampled k-space data. In CS theory, a signal data set which has a sparse representation in a transform domain can be recovered from under-sampled measurements by application of a suitable regularisation algorithm. The possibility of under-sampling leads to a significantly reduced acquisition time. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction (see, for example, M. Lustig et al., Magnetic Resonance in Medicine, 58, 1182-1195, 2007).

In a further preferred embodiment of the invention, the separation of the signal contributions is performed on the basis of a signal model including at least the MR spectrum of each of the chemical species. A signal model is employed that theoretically describes the acquired FID signals as a function of the respective sampling time (as determined by the applied readout strength). The signal model includes at least the (a-priori known) spectrum of each of the chemical species and the (unknown) spin density. The model may further include the (unknown) spatial variation of the main magnetic field in the examination volume, since the spatial inhomogeneity of the main magnetic field also causes phase shifts of the acquired FID signals which need to be distinguished from the phasing caused by the chemical shift. In the process of MR image reconstruction and separation of the contributions of the different chemical species values of all unknown parameters of the signal model may be sought that best fit the acquired FID signals.

According to a preferred embodiment of the invention, a phase map is derived from the acquired FID signals, wherein the inhomogeneity of the main magnetic field is derived from the phase map by exploiting that the phase shift induced by the inhomogeneity of the main magnetic field varies smoothly over space. In other words, an ambiguity in the phasing of the FID signals caused by chemical shift and by the inhomogeneity of the main magnetic field may be resolved according to the invention by using prior information. Such prior information may be, for example, that the main magnetic field varies slowly as a function of the spatial coordinates.

According to a further preferred embodiment of the invention, the readout strength is varied by switching it between two or more pre-selected values between repetitions of the ZTE sequence. This may advantageously be combined with segmented k-space sampling, wherein each segment has the shape of a hollow sphere of a given wall thickness, wherein a different combination of the two or more pre-selected values is applied in sampling of each segment. In this way, by appropriately matching the values of the readout strength and the segmentation of k-space, it can be achieved, that each k-space position within each segment is sampled at least two times, each time with a different value of the readout strength. Simultaneously, a sufficient sampling close to the k-space centre can be accomplished by applying readout magnetic field gradients of low strength for acquisition of the central k-space segments. Higher readout strengths may be applied for the more peripheral segments in order to obtain the desired image resolution.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
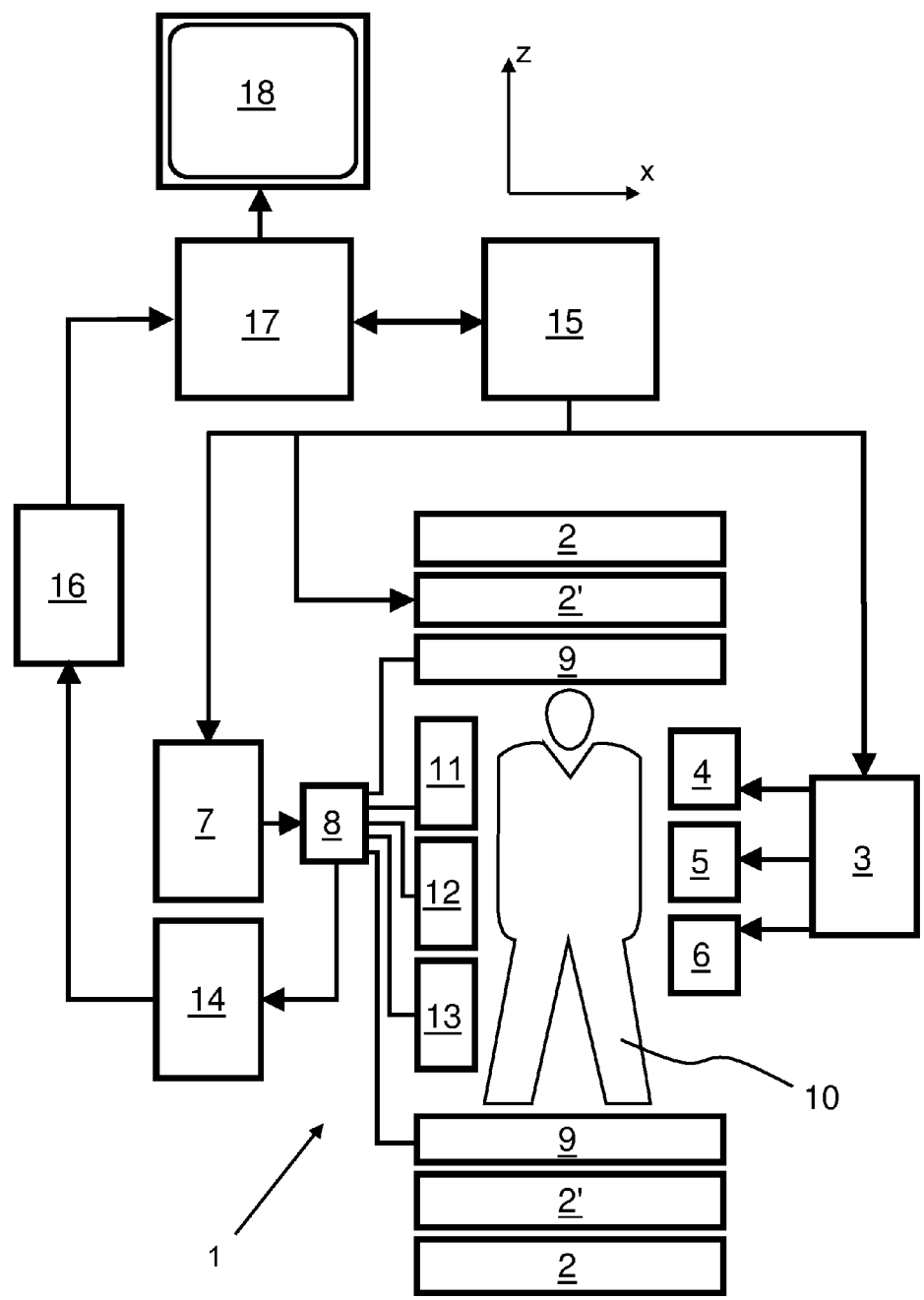
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a -body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate a ZTE imaging sequence according to the invention. The receiver 14 receives a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies an appropriate reconstruction algorithm.

The MR image represents a a three-dimensional volume. The image is then stored in an image memory where it may be accessed for converting projections or other portions of the image representation into appropriate format for visualization, for example via a video monitor 18 which provides a human-readable display of the resultant MR image.

Figure 2:
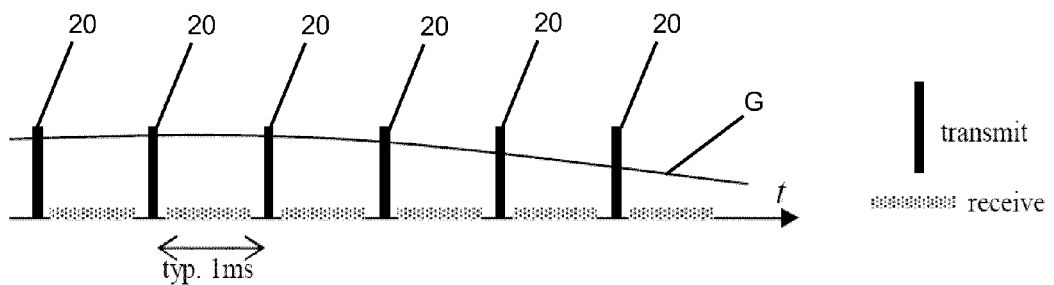
FIG. 2 shows a diagram illustrating the ZTE sequence applied according to the invention.

FIG. 2 shows a diagram illustrating the ZTE sequence applied according to the invention. The essence of the 'silent' ZTE technique is that excitation RF pulses 20 are transmitted simultaneously with 'frequency-encoding' readout magnetic field gradients G being switched on. The readout magnetic field gradient G is not intended as a slice-selection gradient which implies that the RF pulses 20 have to be extremely short (typically 1 µs to 8 µs) in order to achieve sufficient excitation bandwidth. The readout of FID signals takes place during intervals 21 in the presence of the readout magnetic field gradients G immediately after the RF pulses 20. Each interval 21 has a duration between 100 µs and 3 ms. The readout magnetic field gradient G has a readout strength and a readout direction both staying substantially constant over each excitation/readout cycle. After each cycle the readout direction is varied only very gradually. The readout direction changes only slightly, e.g. by a few degrees (e.g. 2°). In a practical example, the magnetic field gradient in one spatial direction ramps up from zero to 'full' in about 45 ms. For a full sampling of k-space the readout direction is varied until a spherical volume is covered with sufficient density.

A known constraint of the ZTE technique is that there is a finite time between the center of each RF pulse 20 and the start of the sampling interval 21. Depending on the equipment used, this 'dead time' may be anything between 2 µs and 20 µs. This means that the center of k-space cannot be scanned. However, it has to be taken into account that the size of the central k-space volume that cannot be sampled depends on the readout strength. The lower the strength of the magnetic field gradient, the smaller is the central k-space region that will not be sampled during the dead time. On the other hand, it is not feasible to apply as weak as possible readout gradients.

Figure 3:
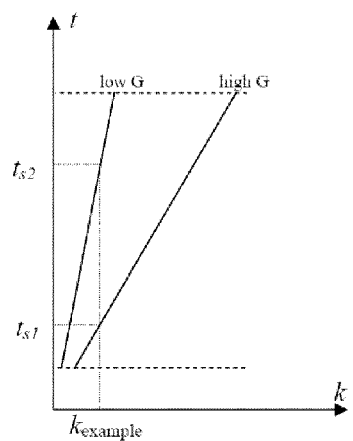
FIG. 3 illustrates the radial sampling of k-space according to an embodiment of the invention using two different readout strengths.

According to the invention, the strength of the readout magnetic field gradient G is varied between repetitions of the ZTE sequence. This is illustrated in the diagram of FIG. 3 showing the interdependence of the k-space position k and the sampling time t (k actually represents three dimensions from which only one is drawn for the purpose of illustration). The application of different readout strengths 'low G' and 'high G' implies that each k-space position is sampled at two or more different sampling times (i.e. the time interval between the RF pulse and the sampling of a given k-space position). As can be seen in FIG. 3, the k-space position $k_{example}$ is 'visited' two times during the scan, namely at $t_{s1}$ (using readout strength 'high G') and at $t_{s2}$ (using readout strength 'low G'). The sampling of each k-space position with two or more different sampling times results in a specific phasing of the acquired FID signals which is induced by the precessional frequency difference of, e.g., hydrogen in fat and water. This is exploited in accordance with the invention to separate the signal contributions from fat and water as in the per se known 'phase unwrapping' techniques applied in Dixon-type MR imaging.

Figure 4:
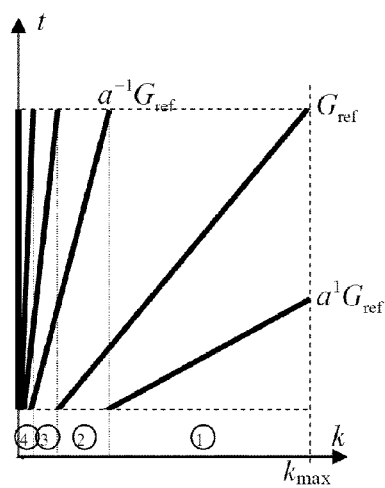
FIG. 4 illustrates the segmented k-space sampling approach of the invention.

FIG. 4 illustrates an embodiment of the invention employing a segmented k-space sampling approach, wherein each segment has the shape of a hollow sphere of a given wall thickness. k-space is to be sampled up to $k_{max}$. The required gradient strength would be (approximately):

$$\frac{k_{max}}{\gamma T_R},$$

wherein $\gamma$ is the gyro-magnetic ratio and $T_R$ is the repetition time of the ZTE sequence. This value will be referred to as:

$$G_{ref}$$

A variable α is introduced:

$$a = \sqrt{\frac{T_R}{T_{deadtime}}},$$

wherein $T_{deadtime}$ is the dead time during which no signal acquisition is possible. A typical value of α is 5. In this embodiment of the invention, FID signals are acquired with the following set of gradient strengths:

$$\alpha^1 G_{ref}, \alpha^0 G_{ref}, \alpha^{-1} G_{ref}, \alpha^{-2} G_{ref}, \alpha^{-3} G_{ref}.$$

Mathematically, this is an infinite series. However, in practice acquisition may be stopped beyond $\alpha^{-3} G_{ref}$ or $\alpha^{-4} G_{ref}$. One additional acquisition should be performed with G=0.

It has to be noted that this proceeding does not result in a large number of extra acquisitions in comparison to a conventional ZTE scan (employing only acquisitions with $\alpha^0 G_{ref}$). Considering the required sampling density of the inner k-space spheres of the proposed segmentation, only a limited number of additional radial k-space samples need to be acquired. Hence, the total number of required cycles of the ZTE sequence may be only about twice the number of cycles in a conventional ZTE scan with comparable imaging parameters.

As can be seen in FIG. 4, each segment 1-4 is sampled with a different combination of two different readout strengths. Simultaneously, an optimal coverage of central k-space (segment 4) is achieved. One might easily increase the number of readout strengths per segment, for example by choosing $$a = \sqrt[3]{\frac{T_R}{T_{deadtime}}}$$

and starting at $\alpha^2 G_{ref}$.

Figure 5:
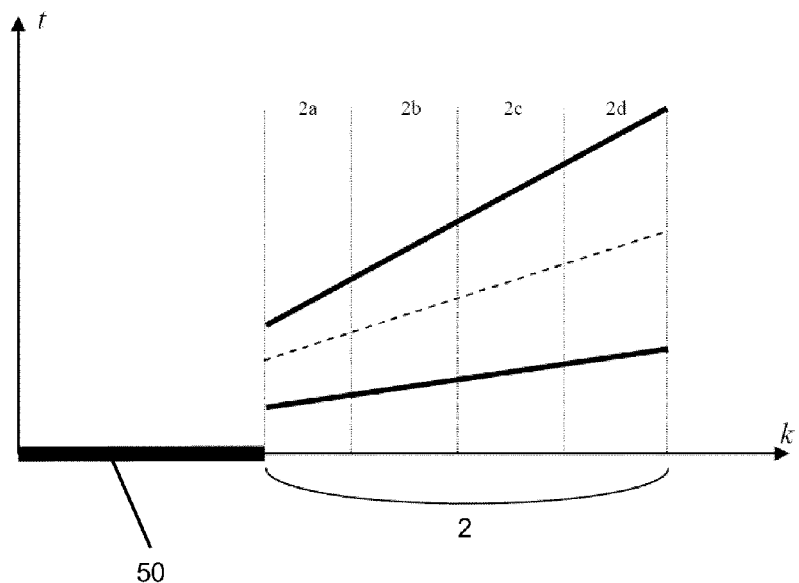
FIGS. 5 and 6 illustrate an iterative scheme for separating chemical shift from spatial inhomogeneity of the main magnetic field in the image reconstruction step of the method of the invention.
Figure 6:
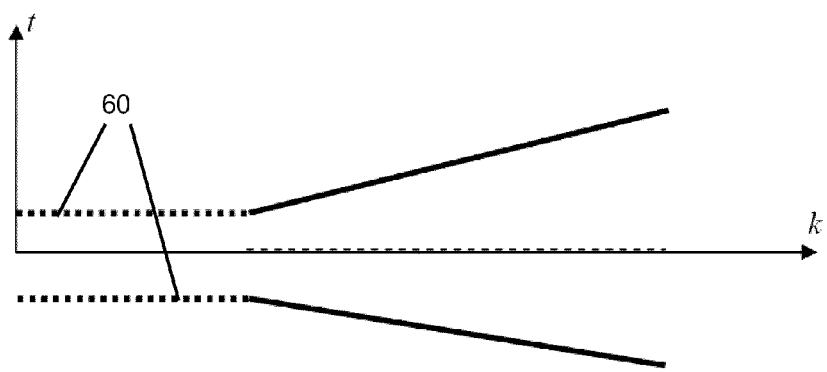

With reference to FIGS. 5 and 6 an iterative scheme for separating chemical shift from main magnetic field inhomogeneity in the image reconstruction step of the method of the invention is explained in the following.

In this embodiment, the reconstruction and the water/fat separation consists of two steps: (a) estimating a phase map, i.e. a map reflecting both main magnetic field inhomogeneity and chemical shift effects (and maybe further phase shift-inducing effects), and (b) separating chemical shift from main magnetic field inhomogeneity by the assumption that the latter varies smoothly over space. Step (b) constitutes the well-known 'phase unwrapping' problem of Dixon water/fat imaging. Since suitable algorithms are well-known and available in existing MR environments this does not need to be further elaborated here.

Step (a) is performed iteratively. The reconstruction step comprises calculating two sets of information over space: (i) the magnetization density (i.e. the 'water and fat' MR image), and (ii) an estimate of the phase map. At each iteration step, these sets are calculated up to a given resolution (i.e. within a full sphere in k-space).

It is assumed that initially estimates of the above two sets of information are available for a small central region of k-space region. In the embodiment shown in FIG. 5, both magnetization density and the phase map are assumed to be known for regions 4 and 3 (indicated by the bold horizontal line 50 at t=0). As a next step of the iteration, estimates are to be computed including region 2.

The dashed line in FIG. 5 represents the 'average' sampling time for the set of k-space samples of region 2. The phase map is known for the sphere enclosed by region 2 (i.e., regions 4 and 3 in this embodiment). This knowledge is applied in reconstructing region 2. Both datasets of region 2 are reconstructed as if they were acquired using the 'average' (dashed) timing of k-space sampling, for example by using a segmented homogeneity correction method (see Douglas C. Noll et al., IEEE Transactions on Medical Imaging, 10, 629-637, 1991). For this purpose, it is useful to sub-segment region 2 into regions 2a, ... 2d, as depicted in FIG. 5. In this way, some distortion caused by magnetic field inhomogeneity is intentionally left in the data. The data reconstructed up to this point behaves as if it were acquired with the sampling timing shown in FIG. 6.

For the central k-space region, both the magnetization density and the phase map are known, as mentioned before. Hence, the signal data can be 'simulated' at any sampling time. In this way, simulated data 60 is added in the central k-space region as indicated by the bold dotted lines in FIG. 6. From these two data sets, the average and the difference, are calculated. Transforming the average and the difference to the spatial domain enables calculation of high-resolution (i.e. including region 2) estimates of the magnetization density and the phase map. In the next step, this process is performed including region 1, and the reconstruction step (a) is accomplished. The iteration may start by estimating a 0-th order estimate of the phase map from the G=0 k-space sample, which can be considered as the most central 'region' in k-space.

On this basis, the separation of chemical shift from main magnetic field inhomogeneity can be performed in step (b), as mentioned above, by the assumption that the latter varies smoothly over space. Algorithms known in the art for Dixon water/fat imaging may be employed for reconstructing separate water and fat images from the magnetization density and the (inhomogeneity-corrected) phase map.

Another embodiment of the invention is in the following discussed with reference to FIG. 7. In this embodiment, the gradient coils along the x, y and z-axes are controlled such that the readout strengths in the respective directions assume mutually independent random values between repetitions of the ZTE sequence, with the 'noise' being frequency-restricted to about 15 Hz or less, in order not to be audible. FID signals are acquired, with a typical duration of each cycle of one millisecond. After, e.g., 200 seconds of scan time, 200.000 FID signals are available, acquired with a distribution of readout directions and readout strengths.

Figure 7:
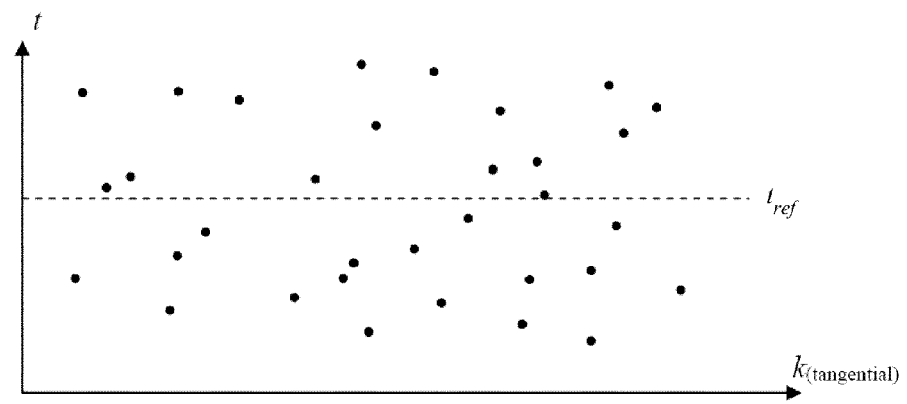
FIG. 7 illustrates random k-space sampling according to a further embodiment of the invention.

The diagram of FIG. 7 shows the sampling time t in relation to the tangential component in k-space for a given radius $k_r$. The central dashed line represents the 'average sampling time' or 'reference sample time' $t_{ref}$. Each of the dots in the diagram represents a FID signal having its characteristic sampling time t at the moment of reaching $k_r$. The resulting data can be considered as comprising a few million points, each with its characteristic values of $k_x$, $k_y$, $k_z$ and t. Their (complex) values are $$s_i = s(k_i, t_i)$$

with i being the index of the point.

For the step of reconstruction and water/fat separation, again the component (a) of estimating the phase map is focused on in the following.

A region size in k-space is defined such that it can be made sure that it includes, in most cases, at least two points $s_i$ with substantially different values of t. For each point, $$s_{A,i} = \frac{1}{\sum_{k_j \in N(k_i)} \delta_j} s_i$$

is calculated. Herein, $N(k_i)$ should be read as 'neighborhood of $k_i$', and $\delta_i$ should be read as 'point present in neighborhood'. In essence, $s_{A,i}$ can be interpreted as 'density-compensated data-point'.

Further, $s_{B,i}$ is calculated as $$\frac{(t_i - t_{ref}) \cdot \sum_{k_j \in N(k_i)} \delta_j - \sum_{k_j \in N(k_i)} (t_j - t_{ref})}{\left(\sum_{k_j \in N(k_i)} \delta_j\right) \cdot \sum_{k_j \in N(k_i)} (t_j - t_{ref})^2 - \left(\sum_{k_j \in N(k_i)} (t_j - t_{ref})\right)^2} s_i,$$

which can be interpreted as 'signal weighted by the difference of the actual sampling time of the data point and the average sampling time in the neighborhood, normalized over the local variance of the sampling time'. In essence, it represents the slope of the signal with respect to sampling time.

As a next step $s_{C,i}$ is calculated as $$\frac{(t_i - t_{ref}) \cdot \sum_{k_j \in N(k_i)} \delta_j - \sum_{k_j \in N(k_i)} (t_j - t_{ref})}{\left(\sum_{k_j \in N(k_i)} \delta_j\right) \cdot \sum_{k_j \in N(k_i)} (t_j - t_{ref})^2 - \left(\sum_{k_j \in N(k_i)} (t_j - t_{ref})\right)^2} s_i \cdot (t_i - t_{ref}),$$

which provides an estimate of how much the signal deviates from what it would have been if it had been measured at $t_{ref}$.

A three-dimensional image $I_{ref}$ is reconstructed from the difference $s_{A,i} - s_{B,i}$. This reconstruction may be performed using a compressed sensing approach. A further three-dimensional image $I_{slope}$ is reconstructed from the data points $s_{B,i}$. As a next step $$-i \frac{I_{slope}}{\gamma I_{ref}}$$

is calculated, wherein i is the imaginary unit and γ is the gyro-magnetic ratio. The result is a direct estimate of the phase map (in units of Tesla). On this basis, again, the separation of chemical shift from main magnetic field inhomogeneity can be performed by assuming that the latter varies smoothly over space, and per se known algorithms can then be employed for reconstructing separate water and fat images.

The invention claimed is:

1. A method of magnetic resonance (MR) imaging of an object positioned in an examination volume of a MR device, the method comprising the steps of:

subjecting the object to an imaging sequence of radio frequency (RF) pulses and switched magnetic field gradients (G), which imaging sequence is a zero echo time sequence comprising:
  i) setting a readout magnetic field gradient (G) having a readout direction and a readout strength;
  ii) radiating a RF pulse in the presence of the readout magnetic field gradient (G);
  iii) acquiring a free induction decay (FID) signal in the presence of the readout magnetic field gradient (G), wherein the FID signal represents a radial k-space sample;
  iv) gradually varying the readout direction;
  v) sampling a spherical volume in k-space by repeating steps i) through iv) a number of times, with the readout strength being varied between repetitions; wherein the readout strength is varied such that individual positions in k-space are sampled at least two times, each time with a different value of the readout strength, such that said k-space position is sampled at two or more different sampling times and
  reconstructing a MR image from the acquired FID signals, wherein signal contributions of two or more chemical species to the acquired FID signals are separated, wherein
  the signal contributions of the two or more chemical species to the FID signals are derived from phase differences of the acquired FID signals induced by the variation of the readout strength and the separation of the signal contributions is performed on the basis of a signal model including at least the MR spectrum of each of the chemical species.

2. The method of claim 1, wherein the signal model further includes the inhomogeneity of the main magnetic field in the examination volume.

3. The method of claim 2, wherein a phase map is derived from the acquired FID signals, wherein the inhomogeneity of the main magnetic field is derived from the phase map by exploiting that the phase shift induced by the inhomogeneity of the main magnetic field varies smoothly over space.

4. The method of claim 1, wherein the readout strength is varied by switching it between two or more pre-selected values.

5. The method of claim 4, wherein k-space is sampled in a segmented fashion, each segment having the shape of a hollow sphere of a given wall thickness, wherein a different combination of the two or more pre-selected values is applied in sampling of each segment.

6. The method of claim 1, wherein the spherical k-space volume is sampled by randomly varying the readout direction and the readout strength.

7. The method of claim 1, wherein compressed sensing is employed for reconstructing the MR image and/or for separating the signal contributions of the two chemical species.

8. A magnetic resonance (MR) device comprising at least one main magnet coil for generating a uniform, steady magnetic field within an examination volume, a number of gradient coils for generating switched magnetic field gradients in different spatial directions within the examination volume, at least one radio frequency (RF) coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the following steps:
  subjecting the object to an imaging sequence of RF pulses and switched magnetic field gradients, which imaging sequence is a zero echo time sequence comprising:
    i) setting a readout magnetic field gradient having a readout direction and a readout strength;
    ii) radiating a RF pulse in the presence of the readout magnetic field gradient (G);
    iii) acquiring a free induction decay (FID) signal in the presence of the readout magnetic field gradient (G), wherein the FID signal represents a radial k-space sample;
    iv) incrementally varying the readout direction;
    v) sampling a spherical volume in k-space by repeating steps i) through iv) a number of times, with the readout strength being varied between repetitions wherein the readout strength is varied such that individual positions in k-space are sampled at least two times, each time with a different value of the readout strength, such that said k-space position is sampled at two or more different sampling times and;
  reconstructing a MR image from the acquired FID signals, wherein signal contributions of two or more chemical species to the acquired FID signals are separated.

9. A non-transitory computer readable medium to be run on a magnetic resonance (MR) device, which comprises instructions for:
  generating an imaging sequence of radio frequency (RF) pulses and switched magnetic field gradients (G), which imaging sequence is a zero echo time sequence comprising:
    i) setting a readout magnetic field gradient (G) having a readout direction and a readout strength;
    ii) radiating a RF pulse in the presence of the readout magnetic field gradient;
    iii) acquiring a free induction decay (FID) signal in the presence of the readout magnetic field gradient, wherein the FID signal represents a radial k-space sample;
    iv) incrementally varying the readout direction;
    v) sampling a spherical volume in k-space by repeating steps i) through iv) a number of times, with the readout strength being varied between repetitions wherein the readout strength is varied such that individual positions in k-space is sampled at least two times, each time with a different value of the readout strength, such that said k-space position is sampled at two or more different sampling times and; wherein
  the signal contributions of the two or more chemical species to the FID signals are derived from phase differences of the acquired FID signals induced by the variation of the readout strength and
  the separation of the signal contributions is performed on the basis of a signal model including at least the MR spectrum of each of the chemical species and
  reconstructing a MR image from the acquired FID signals, wherein signal contributions of two or more chemical species to the acquired FID signals are separated.

* * * * *